(12) United States Patent
Casagrande et al.

(10) Patent No.: US 11,245,362 B1
(45) Date of Patent: Feb. 8, 2022

(54) CRYSTAL OSCILLATOR AND STARTUP METHOD FOR A CRYSTAL OSCILLATOR

(71) Applicant: The Swatch Group Research and Development Ltd, Marin (CH)

(72) Inventors: Arnaud Casagrande, Bole (CH); Jean-Luc Arend, Corcelles (CH)

(73) Assignee: The Swatch Group Research and Development Ltd, Marin (CH)

(*) Notice: Subject to any disclaimer, the term of this patent is extended or adjusted under 35 U.S.C. 154(b) by 0 days.

(21) Appl. No.: 17/341,484

(22) Filed: Jun. 8, 2021

(30) Foreign Application Priority Data

Sep. 7, 2020 (EP) .................................... 20194779

(51) Int. Cl.
*H03B 5/32* (2006.01)
*H03B 5/06* (2006.01)
*H03K 3/012* (2006.01)

(52) U.S. Cl.
CPC .................. *H03B 5/32* (2013.01); *H03B 5/06* (2013.01); *H03K 3/012* (2013.01)

(58) Field of Classification Search
CPC ............. H03B 5/06; H03B 5/32; H03K 3/012
USPC ............ 331/158, 116 FE; 368/155, 156, 159
See application file for complete search history.

(56) References Cited

U.S. PATENT DOCUMENTS 5,150,081 A * 9/1992 Goldberg ............... H03K 3/012
331/109
2007/0030085 A1 2/2007 Brennan et al.

FOREIGN PATENT DOCUMENTS

WO WO 2007/060210 A1 5/2007

OTHER PUBLICATIONS

European Search Report dated Feb. 18, 2021 in European Application 20194779.3 filed Sep. 7, 2020, 2 pages.
Markus et al., "A 32 MHz Crystal Oscillator with Fast Start-Up Using Dithered Injection and Negative Resistance Boost" ESSCIRC 2019—IEEE 45th European Solid State Circuits Conference (ESSCIRC), IEEE, Sep. 23, 2019, XP033660851, doi:10.1109/esscirc.2019. 8902894 pp. 49-52.

* cited by examiner

*Primary Examiner* — Arnold M Kinkead
(74) *Attorney, Agent, or Firm* — Oblon, McClelland, Maier & Neustadt, L.L.P.

(57) ABSTRACT

A crystal oscillator and a startup method for initiating operation of a crystal oscillator with a crystal resonator including a first terminal and a second terminal, an electronic oscillator circuit connected to the crystal resonator, a first capacitor including first and second terminals, the second connected to the first terminal of the crystal resonator, a second capacitor including first and second terminals, the second connected to the second terminal of the crystal resonator. A switch includes first, second and third terminals, wherein an electrical conductivity between the first terminal and the second terminal of the switch is controllable by a voltage at the third terminal, wherein the first terminal of the switch is connected to the first terminal of the first capacitor and wherein the second terminal of the switch is connected to the first terminal of the second capacitor.

13 Claims, 1 Drawing Sheet

CRYSTAL OSCILLATOR AND STARTUP METHOD FOR A CRYSTAL OSCILLATOR

CROSS-REFERENCE TO RELATED APPLICATION

This application claims priority to European Patent Application No. 20194779.2 filed on Sep. 7, 2020, the entire disclosure of which is hereby incorporated herein by reference.

FIELD OF THE INVENTION

The present disclosure relates to a crystal oscillator and to a portable electronic device comprising such a crystal oscillator. In another aspect, the disclosure relates to a method of initiating operation of a crystal oscillator.

BACKGROUND OF THE INVENTION

Crystal oscillators are widely known in the prior art. A crystal oscillator is an electronic oscillating circuit that uses the mechanical resonance of a vibrating crystal of piezoelectric material to create an electric signal with a precise frequency. This frequency is often used to keep track of time, as in quartz-controlled wristwatches in order to provide a stable clock signal for digital integrated circuits and/or to stabilize frequencies for radio transmitters and receivers.

Conventional crystal oscillators of the so-called Pierce- or Colpitts-type design are typically provided with two capacitors that are usually excited by a controller to provide a rather fast startup of the oscillator. For a fast startup of the crystal oscillator the crystal is usually electrically excited at its terminals. The terminals of the crystal are typically charged by a first capacitor and a second capacitor, respectively. For this, an excitation circuit provides loading and unloading of the two capacitors, which in turn are connected to ground. With such a conventional oscillator architecture there is a significant consumption of electric power caused by the frequent loading and unloading of the capacitors being tied to ground.

It is therefore an object of the present disclosure to provide an improved crystal oscillator that provides a rather fast startup sequence and which consumes less electric power compared to solutions known so far. This is of particular interest for mobile applications, wherein the crystal oscillator is driven by a battery that provides a finite source of electric energy.

SUMMARY

The above demands will be solved by a crystal oscillator, by a portable electronic device as well as by a method of initiating operation of a crystal oscillator in accordance to the features of the independent claims. Further features of the invention are subject matter of the dependent claims.

In one aspect there is provided a crystal oscillator. The crystal oscillator comprises a crystal resonator comprising a first terminal and a second terminal. The crystal oscillator further comprises an electronic oscillator circuit connected to the crystal resonator. The crystal oscillator further comprises a first capacitor and a second capacitor. The first capacitor comprises a first terminal and a second terminal. The second terminal of the first capacitor is connected to the first terminal of the crystal resonator. The second capacitor also comprises a first terminal and a second terminal. Also here, the second terminal is connected to the second terminal of the crystal resonator.

The crystal oscillator further comprises a switch. The switch comprises a first terminal, a second terminal and a third terminal. By way of the third terminal the conductivity of the switch across first and second terminals can be controlled and/or modified. In other words, an electrical conductivity between the first terminal and the second terminal of the switch is controllable by a voltage at the third terminal. The first terminal of the switch is connected to the first terminal of the first capacitor and the second terminal of the switch is connected to the first terminal of the second capacitor.

By means of the switch and for a startup phase of the crystal oscillator the crystal resonator can be excited by a frequent charging and discharging of first and second capacitors. Once the oscillation has started the switch allows and provides to reduce the impedance of the oscillator. Typically, the switch allows switching of the crystal oscillator from a startup mode into a driving mode. In the driving mode the conductivity between first and second terminals of the switch is comparatively low.

In effect, the switch is opened thus providing regular charging and discharging of first and second capacitors. When switched into the driving mode the conductivity between the first terminal and the second terminal of the switch is increased. The first and second conductors are then effectively decoupled from a controller or startup controller and power consumption can be significantly reduced. When switched in the driving mode there is no longer any need to load and to unload the first and second capacitors. Rather, the capacitors now operate and behave as so-called coupling capacitors.

According to a further embodiment the electronic oscillator circuit comprises an input terminal and an output terminal. The input terminal of the electronic oscillator circuit is connected to the first terminal of the crystal resonator. The output terminal of the electronic oscillator circuit is connected to the second terminal of the crystal resonator. In effect, the crystal resonator is connected in parallel to input and output terminals of the electronic oscillator circuit. Moreover, the first capacitor is in series with the first terminal of the crystal resonator. The second capacitor is in series with the second terminal of the crystal resonator. Accordingly, the first capacitor is in series with the input terminal of the electronic oscillator circuit and the second capacitor is in series with the output terminal of the electronic oscillator circuit.

The switch is typically connected between first terminals of first and second capacitors. In this way the electrical conductivity between the first terminals of first and second capacitors can be modified during and/or for the startup procedure of the crystal oscillator. When in the startup mode the switch is typically open and there is no connection between the first terminals of first and second capacitors. When switching the crystal oscillator into the driving mode the first terminals of the first and second capacitors can be effectively connected, thereby reducing the impedance to ground as well as to effectively decoupled the first and second capacitors from an injection source, e.g. provided by a startup controller.

Accordingly and with a further example of the crystal oscillator the operation of the crystal oscillator is switchable from the start up mode into the driving mode. When in the startup mode, the conductivity between the first terminal and the second terminal of the switch is lower than the conductivity between the first terminal and a second terminal of the switch when in the driving mode. Typically, the switch is implemented as a MOS transistor, comprising a drain, a source and a gate. Drain and source are connected to the first terminals of first and second capacitors, respectively. The voltage at the gate may be typically controllable by a startup controller. In this way, the startup controller is operable and enables to switch the transistor and hence the switch between the start of mode and the driving mode.

According to a further example the crystal oscillator comprises a first buffer amplifier and a second buffer amplifier. An output terminal of the first buffer amplifier is connected to the first terminal of the first capacitor. An output terminal of the second buffer amplifier is connected to the first terminal of the second capacitor.

First and second buffer amplifiers provide electrical impedance transformation of a startup controller to the first and second capacitors and hence to the electronic oscillator circuit. In this way and in accordance to the theory of Thévenin the impedance effectively provided at the crystal resonator, typically implemented as a quartz crystal, may remain comparatively constant over time. Hence during the startup mode as well as during the driving mode the impedance seen by the crystal resonator may remain effectively constant and/or unaltered. This is of particular benefit for the operation of the electronic oscillator circuit and for the generation of a clock signal provided by the electronic oscillator circuit especially when the crystal oscillator is switched from the startup mode into the driving mode.

According to another example the crystal oscillator comprises a startup controller comprising a phase output and a startup control output. Typically, the startup controller is configured to initiate and to control a startup procedure of the crystal oscillator. The phase output of the startup controller is typically connected or is connectable to the crystal resonator and/or to first and second capacitors in order to provide resonator excitation or phase injection of the electronic oscillator circuit.

The startup control output is effective and operable to control the operation mode of the crystal oscillator. Hence, the startup control output is configured to provide a respective control signal to the switch for switching between the startup mode and the driving mode of the crystal oscillator.

According to a further example the startup control output of the startup controller is connected to the third terminal of the switch. The startup control output is particularly operable to change the configuration of the switch and hence the mode of operation of the oscillator circuit. In this way the startup controller has a rather direct control of the operation mode of the crystal oscillator.

According to another example a phase signal provided at the phase output of the startup controller is coupleable to the first terminal of the first capacitor as a first phase signal. The phase signal provided at the phase output may be further coupleable to the first terminal of the second capacitor as a second phase signal. Typically, first and second phase signals are phase shifted. First and second phase signals may be mutually inverted or may complement each other. First and second phase signals are oscillating signals by way of which at least during the startup mode the first and second capacitors can be regularly or frequently charged and discharged.

Typically and with another example the second phase signal present to the first terminal of the second capacitor is phase shifted and/or inverted to the first phase signal present at or provided to the first terminal of the first capacitor. In order to provide mutually corresponding but phase shifted or inverted first and second phase signals one of the first terminals of the first and second capacitors is directly connected to the phase output of the startup controller whereas another one of the first terminals of the first and second capacitors is connected to the phase output of the startup controller via an inverter.

Typically, first and second phase signals are derived and/or are obtained from a common source, namely from the phase output of the startup controller. In this way a well-defined phase shift between first and second phase signals can be obtained and maintained.

According to another example the crystal oscillator comprises a first logic gate and a second logic gate. The first and second logic gates each comprise a first input terminal and a second input terminal. The first input terminals of the first and second logic gates is connected to the phase output of the startup controller. The second input terminals of the first and second logic gates are connected to the startup control output of the startup controller.

With some examples at least one of the first and second logic gates is implemented as a logical AND gate. With some examples, both, first and second logic gates are implemented as logic AND gates. Here, one of the first input terminals of first and second logic gate may be directly connected to the phase output of the startup controller wherein the other one of the first input terminals of first and second logic gates may be connected to the phase output of the startup controller via an inverter.

With other examples one of the first logic gate is implemented as a logic AND gate and the other one of first and second logic gates is implemented as a logical NAND gate.

When both logic gates are implemented as a logic AND gate the output of respective first and second gates can be effectively set to zero by a respective control signal provided by the startup control output of the startup controller. Typically, the output of first and second logic gates is connected to an input of the first and second buffer amplifiers, respectively and/or to first terminals of first and second capacitors, respectively.

By setting the startup control signal provided at the startup control output to a logical zero the phase injection of the first and second capacitors by the startup controller can be effectively switched off.

According to a further example one of the first input terminals of the first and second logic gate is coupled to the phase output by an inverter. Assumed that the phase output of the startup controller provides a periodic oscillating signal the output of the first logic gates can be effectively inverted or phase shifted by 180° compared to the output of the second logic gate. In this way the required phase shifting between first and second phase signals for charging or discharging first and second capacitors and/or for driving first and second buffer amplifiers can be provided.

According to another example the second input terminals of the first and second logic gates are connected to the third terminal of the switch via an inverter. In this way a concurrent operation of first and second logic gates compared to the switching behavior of the switch can be provided. In effect and by making use of an inverter between the third terminal of the switch and second input terminals of first and second logic gates the switch can be effectively turned on, thereby switching the crystal oscillator into the driving mode. Simultaneously or concurrent with the switching on of the switch the first and second logic gates can be effectively shut down and first and second phase signals for charging first and second capacitors will no longer be generated. This way electric power can be effectively saved.

According to a further example an output terminal of the first logic gate is connected to an input terminal of the first buffer amplifier and an output terminal of the second logic gate is connected to an input terminal of the second buffer amplifier. In this way first and second logic gates are operable to drive respective first and second buffer amplifiers. In effect the first logic gate, the first buffer amplifier and the first capacitor are arranged in series. Accordingly, also the second logic gate, the second buffer amplifier and the second capacitor are arranged in series.

According to another aspect there is provided a portable electronic device. The portable electronic device may be implemented as a wearable electronic device configured to be worn by a user. The portable electronic device comprises a housing, an electric source of energy and a crystal oscillator as described above and being arranged inside the housing. Here, the crystal oscillator is driven or powered by the electric source of energy. The electric source of energy may comprise a battery. The battery may be implemented as a rechargeable battery. The portable or wearable electronic device may be implemented as a watch, as a wrist watch or as a smart watch. The crystal oscillator provides a clock signal and hence an output terminal providing a well-defined clock for driving an electronic circuit of the portable electronic device.

According to a further example the portable electronic device comprises a display and a clockwork mechanism. The clockwork mechanism is operably connected to the display. The clockwork mechanism comprises the crystal oscillator. The clockwork mechanism may be implemented mechanically and/or electronically. When implemented mechanically, a clockwork mechanism comprises at least the crystal oscillator as described above that provides a well-defined clock signal for driving of the mechanically implemented clockwork mechanism.

According to another aspect the present disclosure also relates to a method of initiating operation of the crystal oscillator. The method comprises the steps of providing a crystal oscillator as described above and operating the crystal oscillator in a startup mode. During the startup mode first and second phase signals are provided to first and second capacitors of the crystal oscillator. Typically, and as the oscillation starts the switch of the crystal oscillator is operated thereby switching the crystal oscillator from the startup mode into a driving mode. Upon or by way of switching the crystal oscillator into the driving mode the first and second capacitors are no longer provided with first and second phase signals and an electric energy consumption of the crystal oscillator can be reduced to a minimum.

BRIEF DESCRIPTION OF THE DRAWINGS

In the following, an example of a crystal oscillator is illustrated in greater detail by making reference to the drawings, in which.

DETAILED DESCRIPTION

Figure 1:
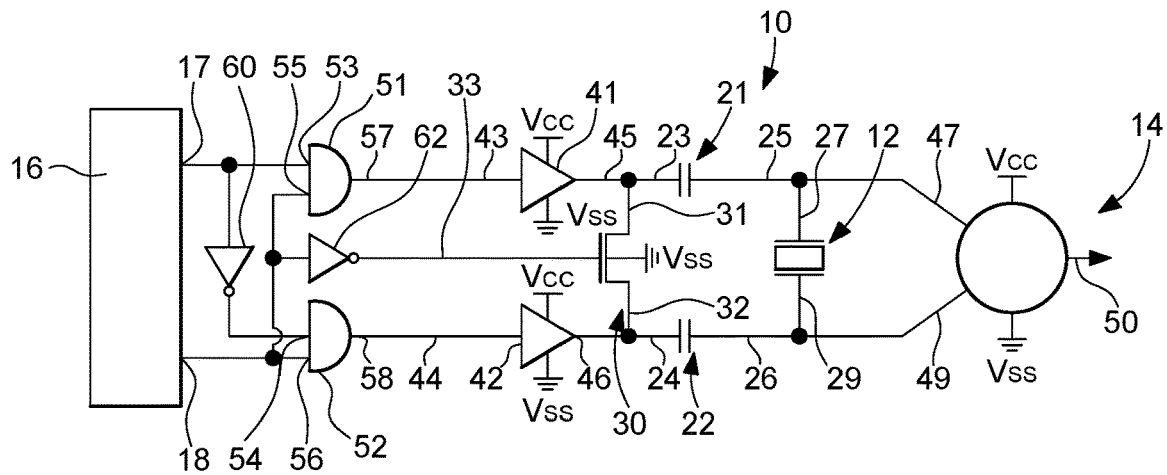
FIG. 1: schematically illustrates a block diagram of an example of the crystal oscillator.

In FIG. 1 a block diagram of one implementation of the crystal oscillator 10 is described in greater detail. The crystal oscillator 10 comprises a crystal resonator 12. The crystal resonator 12 typically comprises a quartz crystal. The crystal oscillator 10 further comprises an electronic oscillator circuit 14 electrically connected to the crystal resonator 12. The crystal resonator 12 and the electronic oscillator circuit 14 are connected in parallel. The electronic oscillator circuit 14 comprises an output terminal 50 by way of which a well-defined and frequency stabilized clock signal synchronized to the resonance frequency of the crystal resonator 12 can be provided.

The crystal oscillator 10 further comprises first and second capacitors 21, 22. The first and second capacitors 21, 22 are connected to respective input and output terminals 47, 49 of the electronic oscillator circuit 14. In detail the first capacitor 21 comprises a second terminal 25 electrically connected to a first input terminal 47 of the electronic oscillator circuit 14. The second capacitor 22 comprises a second terminal 26 electrically connected to a second output terminal 49 of the electronic oscillator circuit.

The crystal resonator 12 comprises a first terminal 27. The first terminal 27 being electrically connected to the second terminal 25 and through the first input terminal 47. The second terminal 29 of the crystal resonator 12 is electrically connected to the second terminal 26 of the second capacitor 22 and to the second output terminal 49 of the electronic oscillator circuit 14.

The crystal oscillator 10 further comprises a switch 30. The switch 30 may be implemented as a MOS transistor. The switch 30 comprises a first terminal 31, a second terminal 32 and at least a third terminal 33. First and second terminals 31, 32 are implemented by the source and drain of the transistor. The third terminal 33 is implemented by a gate of the transistor or switch 30. The first terminal 31 of the switch 30 is connected to a first terminal 23 of the first capacitor 21. The second terminal 32 of the switch 30 is connected to a first terminal 24 of the second capacitor 22.

The first and second capacitors 21, 22 are operable to inject a driving frequency into the crystal resonator 12 and/or into the electronic oscillator circuit 14. The capacitors 21, 22 are typically driven by a phase signal provided by a phase output 17 of a startup controller 16. The startup controller 16 serves to provide phase shifted driving signals to the first and second capacitors 21, 22, at least during a startup phase of a startup procedure of the crystal oscillator 10.

In particular, the switch 30 is configured to switch the crystal oscillator 10 between a startup mode and a driving mode. In the startup mode the first and second capacitors 21, 22 are frequently charged and discharged by the startup controller 16. In the driving mode the first and second capacitors 21, 22 are effectively decoupled from the startup controller 16.

In the startup mode the switch 30 is opened, hence the conductivity between the first terminal 31 and the second terminal 32 of the switch 38 is comparatively low. Switching of the switch 30 leads to an increase of the conductivity between the first and the second terminals 31, 32. In this way the impedance seen by the electronic oscillator circuit 14 can be reduced and power consumption of the crystal oscillator during the startup phase can be reduced significantly.

The startup controller 16 comprises the phase output 17 and a startup control output 18. The phase output 17 provide an oscillating phase signal with a frequency, typically in the range of the frequency of the crystal resonator 12. The startup control output 18 provides a startup control signal. The startup control signal can be either a logical one or a logical zero. If the startup control signal provided at the startup control output 18 is high or equals a logical one, the crystal oscillator 10 is in the startup mode. If the signal at the startup control output 18 is zero or low the crystal oscillator 10 is in the driving mode.

As indicated in FIG. 1 the third terminal 33 of the switch 30 connected to the startup control output 18 via an inverter 62. In this way the switch 30 is effectively switched off when the startup control signal at the startup control output 18 is high. Vice versa, the switch 30 is turned on when the startup control signal at the startup control output 18 is low or zero.

The crystal oscillator 10 further comprises a first logic gate 51 and a second logic gate 52. First and second logic gates 51, 52 are both implemented as logical AND gates. The first logic gate 51 comprises a first input terminal 53 connected to the phase output 17 of the startup controller 16. A second input terminal 55 is connected to the startup control output 18 of the startup controller 16. Likewise, the second logic gate 52 comprises a first input terminal 54 and a second input terminal 56. The second input terminal 56 is connected to the startup control output 18 of the startup controller 16. The first input terminal 54 is connected to the phase output 17 of the startup controller 16 via another inverter 60.

In this way and by means of the inverter 60 input signals provided at the first input terminals 53, 54 of first and second logic gates 51, 52 are mutually inverted or phase shifted by 180°. In this way correspondingly phase shifted or inverted signals can be provided at the output terminals 57, 58 of the first and second logic gates 51, 52, respectively.

The output terminal 57 of the first logic gate 51 is connected to an input terminal 43 of a first buffer amplifier 41. A respective output 45 of the first buffer amplifier 41 is connected to the first terminal 31 of the switch 30 and to the first terminal 23 of the first capacitor 21. Likewise, there is provided a second buffer amplifier 42. An input terminal 44 of the second buffer amplifier 42 is connected to an output 58 of the second logic gate 52. The output terminal 46 of the second buffer amplifier 42 is connected to the second terminal 32 of the switch 30 and to the first terminal 24 of the second capacitor 22.

The buffer amplifier is 41, 42 the incident impedance as seen by the crystal resonator 12 can be kept substantially constant for each operation mode of the crystal oscillator. In this way a rather constant and stable frequency output can be provided at the output terminal 50 of the electronic oscillator circuit 14.

The implementation of two logic AND gates 51, 52 and the coupling of the second input terminals 55, 56 of the logic gates 51, 52 with the startup control output 18 together with the inverted coupling of the third terminal 33 of the switch 30 to the startup control output 18 provides a concurrent switching behavior. As the switch 30 is effectively switched off, hence when the startup control signal provided at the startup control output is high the first and second logic gates 51, 52 provide phase shifted first and second phase signals by way of which the first and second buffer amplifier 41, 42 can be driven and by way of which the first and second capacitors 21, 22 can be charged and discharged, respectively.

As the startup control output 18 is switched to a logical zero the switch 30 is effectively switched on and the phase injection provided by the arrangement of first and second logic gates 51, 52, first and second buffer amplifiers 41, 42 is effectively switched off rather simultaneously.

Figure 2:
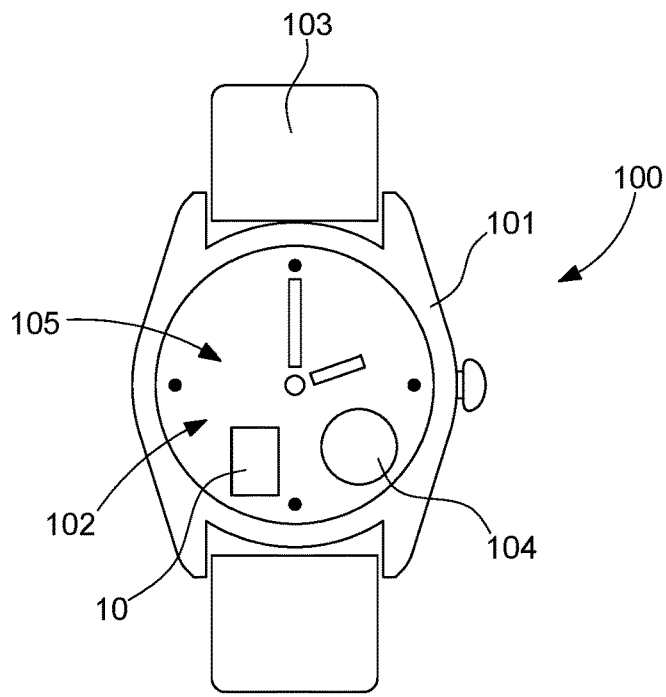
FIG. 2: schematically shows an example of a portable electronic device equipped with the crystal oscillator

In FIG. 2, an example of a portable electronic device 100 implemented as a wristwatch is illustrated. The portable electronic device 100 comprises a housing 110 and a wristband 103. The electronic device 100 is further provided with a clockwork mechanism 105 connected or coupled with a display 102. As only briefly indicated in FIG. 2 the electronic device is further equipped with an electronic energy source 104, such as a battery and with a crystal oscillator 10 as described above. The crystal oscillator 10 provides a well-defined, frequency-stabilized and hence a rather precise clock signal.

Figure 3:
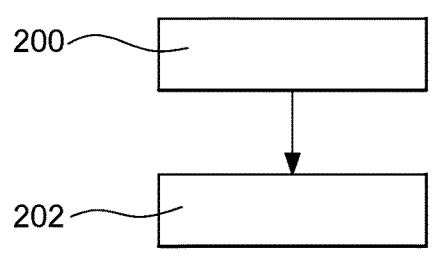
FIG. 3: shows a flowchart of a method of initiating operation of the crystal oscillator.

Finally, in FIG. 3 a flowchart of a method of initiating operation of a crystal oscillator as described above is schematically illustrated. The method makes use of the crystal oscillator 10 as described above in connection with FIG. 1. In a first step 200 the crystal oscillator 10 is operated in a startup mode. Here, first and second phase signals are provided to first and second capacitors 21, 22 of the crystal oscillator 10. Thereafter and when the electronic oscillator circuit 14 starts to oscillate the crystal oscillator 10 is switched into a driving mode by making use of the switch 30 of the crystal oscillator.

Switching of the crystal oscillator from the startup mode into the driving mode is typically governed by the startup controller 16 as the electronic oscillator circuit 14 starts to oscillate. For this, there may be provided a feedback (not illustrated) from the electronic oscillator circuit 14 to the startup controller 16.

REFERENCE NUMBERS 10 crystal oscillators
12 crystal resonator
14 electronic oscillator circuit
16 startup controller
17 phase output
18 startup control output
21 capacitor
22 capacitor
23 terminal
24 terminal
25 terminal
26 terminal
27 terminal
29 terminal
30 switch
31 terminal
32 terminal
33 terminal
41 buffer amplifier
42 buffer amplifier
43 input terminal
44 input terminal
45 output terminal
46 output terminal
47 terminal
49 terminal
50 output terminal
51 logic gate
52 logic gate
53 input terminal
54 input terminal
55 input terminal
56 input terminal
57 output terminal
58 output terminal
60 inverter
62 inverter
100 electronic device
101 housing
102 display 103 wristband
104 electric energy source
105 clockwork mechanism

The invention claimed is:

1. A crystal oscillator comprising:
a crystal resonator comprising a first terminal and a second terminal,
an electronic oscillator circuit connected to the crystal resonator, the crystal resonator and the electronic oscillator circuit being connected in parallel, and the electronic oscillator circuit comprising an output terminal by way of which a well-defined and frequency stabilized clock signal synchronized to the resonance frequency of the crystal resonator is provided,
a first capacitor comprising a first terminal and a second terminal, the second terminal connected to the first terminal of the crystal resonator,
a second capacitor comprising a first terminal and a second terminal, the second terminal connected to the second terminal of the crystal resonator, wherein
a switch comprising a first terminal, a second terminal and a third terminal, wherein an electrical conductivity between the first terminal and the second terminal of the switch is controllable by a voltage at the third terminal, wherein the first terminal of the switch is connected to the first terminal of the first capacitor and wherein the second terminal of the switch is connected to the first terminal of the second capacitor, and
the crystal oscillator comprising a first buffer amplifier and a second buffer amplifier, wherein an output terminal of the first buffer amplifier is connected to the first terminal of the first capacitor and wherein an output terminal of the second buffer amplifier is connected to the first terminal of the second capacitor.

2. The crystal oscillator of claim 1, wherein the electronic oscillator circuit comprises a first input terminal and a second output terminal, wherein the first input terminal of the electronic oscillator circuit is connected to the first terminal of the crystal resonator and wherein the second output terminal of the electronic oscillator circuit is connected to the second terminal of the crystal resonator.

3. The crystal oscillator according to claim 1, wherein an operation of the crystal oscillator is switchable from a startup mode into a driving mode, wherein when in the startup mode, the conductivity between the first terminal and the second terminal of the switch is lower than the conductivity between the first terminal and the second terminal of the switch when in the driving mode.

4. The crystal oscillator according to claim 1, further comprising a startup controller comprising a phase output and a startup control output.

5. The crystal oscillator according to claim 4, wherein the startup control output is connected to the third terminal of the switch.

6. The crystal oscillator according to claim 4, wherein a phase signal provided at the phase output is coupleable to the first terminal of the first capacitor as a first phase signal and wherein the phase signal provided at the phase output is further coupleable to the first terminal of the second capacitor as a second phase signal, wherein the first phase signal and the second phase signal are phase shifted.

7. The crystal oscillator according to claim 6, further comprising a first logic gate and a second logic gate, the first and second logic gates each comprise a first input terminal and a second input terminal, wherein the first input terminals of the first and second logic gate being connected to the phase output of the startup controller and wherein the second input terminals of the first and second logic gates are connected to the startup control output of the startup controller.

8. The crystal oscillator according to claim 7, wherein one of the first input terminals of the first and second logic gates is coupled to the phase output by an inverter.

9. The crystal oscillator according to claim 7, wherein the second input terminals of the first and second logic gates are connected to the third terminal of the switch via an inverter.

10. The crystal oscillator according to claim 7, wherein an output terminal of the first logic gate is connected to an input terminal of the first buffer amplifier and wherein an output terminal of the second logic gate is connected to an input terminal of the second buffer amplifier.

11. A portable electronic device comprising a housing, an electric source of energy and a crystal oscillator according to claim 1 and arranged inside the housing, wherein the crystal oscillator is driven by the electric source of energy.

12. The portable electronic device according to claim 11, further comprising a display and a clockwork mechanism operably connected to the display, wherein the clockwork mechanism comprises the crystal oscillator.

13. A method of initiating operation of a crystal oscillator, the method comprising the steps of:
providing a crystal oscillator according to claim 1,
operating the crystal oscillator in a startup mode thereby providing first and second phase signals to the first and the second capacitors of the crystal oscillator,
switching of the switch of the crystal oscillator thereby switching the crystal oscillator from the startup mode into a driving mode.

* * * * *